(12) United States Patent
Ramaswamy et al.

(10) Patent No.: US 7,851,307 B2
(45) Date of Patent: Dec. 14, 2010

(54) METHOD OF FORMING COMPLEX OXIDE NANODOTS FOR A CHARGE TRAP

(75) Inventors: Nirmal Ramaswamy, Boise, ID (US); Gurtej Sandhu, Boise, ID (US); Bhaskar Srinivasan, Boise, ID (US); John Smythe, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 515 days.

(21) Appl. No.: 11/840,485

(22) Filed: Aug. 17, 2007

(65) Prior Publication Data

US 2009/0045447 A1 Feb. 19, 2009

(51) Int. Cl.
*H01L 21/336* (2006.01)

(52) U.S. Cl. .................. 438/258; 438/257; 438/287; 438/485; 438/583

(58) Field of Classification Search ......... 438/257–258, 438/287, 485, 583–776
See application file for complete search history.

(56) References Cited

U.S. PATENT DOCUMENTS

| | | | |
|---|---|---|---|
| 4,262,631 A | 4/1981 | Kubacki | |
| 4,277,320 A | 7/1981 | Beguwala et al. | |
| 4,298,629 A | 11/1981 | Nozaki et al. | |
| 4,363,828 A | 12/1982 | Brodsky et al. | |
| 4,495,218 A | 1/1985 | Azuma et al. | |
| 4,585,671 A | 4/1986 | Kitagawa et al. | |
| 4,684,542 A | 8/1987 | Jasinski et al. | |
| 4,715,937 A | 12/1987 | Moslehi et al. | |
| 4,834,020 A | 5/1989 | Bartholomew | |
| 4,851,095 A | 7/1989 | Scobey et al. | |
| 5,112,773 A | 5/1992 | Tuttle | |
| 5,227,329 A | 7/1993 | Kobayashi et al. | |
| 5,389,398 A | 2/1995 | Suzuki et al. | |
| 5,389,570 A | 2/1995 | Shiozawa | |
| 5,418,180 A | 5/1995 | Brown | |
| 5,453,858 A | 9/1995 | Yamazaki | |
| 5,607,724 A | 3/1997 | Beinglass et al. | |
| 5,612,558 A | 3/1997 | Harshfield | |

(Continued)

FOREIGN PATENT DOCUMENTS

EP 1 104 012 5/2001

(Continued)

OTHER PUBLICATIONS

Baron et al., "Low pressure chemical vapor deposition growth of silicon quantum dots on insulator for nanoelectronics devices," *Applied Surface Science*, 164:29-34 (2000).

(Continued)

*Primary Examiner*—Dung A. Le
(74) *Attorney, Agent, or Firm*—Knobbe, Martens, Olson & Bear LLP

(57) ABSTRACT

Methods and devices are disclosed, such as those involving forming a charge trap for, e.g., a memory device, which can include flash memory cells. A substrate is exposed to temporally-separated pulses of a titanium source material, a strontium source material, and an oxygen source material capable of forming an oxide with the titanium source material and the strontium source material to form the charge trapping layer on the substrate.

26 Claims, 8 Drawing Sheets

U.S. PATENT DOCUMENTS

| | | | |
|---|---|---|---|
| 5,614,257 | A | 3/1997 | Beinglass et al. |
| 5,648,293 | A | 7/1997 | Hayama et al. |
| 5,656,531 | A | 8/1997 | Thakur et al. |
| 5,695,819 | A | 12/1997 | Beinglass et al. |
| 5,698,771 | A | 12/1997 | Shields et al. |
| 5,700,520 | A | 12/1997 | Beinglass et al. |
| 5,714,760 | A | 2/1998 | Asatourian |
| 5,714,766 | A | 2/1998 | Chen et al. |
| 5,786,027 | A | 7/1998 | Rolfson |
| 5,789,030 | A | 8/1998 | Rolfson |
| 5,837,580 | A | 11/1998 | Thakur et al. |
| 5,874,129 | A | 2/1999 | Beinglass et al. |
| 5,876,797 | A | 3/1999 | Beinglass et al. |
| 5,885,869 | A | 3/1999 | Turner et al. |
| 5,907,792 | A | 5/1999 | Droopad et al. |
| 5,916,365 | A | 6/1999 | Sherman |
| 6,015,590 | A | 1/2000 | Suntola et al. |
| 6,027,705 | A | 2/2000 | Kitsuno et al. |
| 6,054,350 | A | 4/2000 | Hsieh et al. |
| 6,083,810 | A | 7/2000 | Obeng et al. |
| 6,087,229 | A | 7/2000 | Aronowitz et al. |
| 6,136,654 | A | 10/2000 | Kraft et al. |
| 6,153,472 | A | 11/2000 | Ding et al. |
| 6,159,828 | A | 12/2000 | Ping et al. |
| 6,165,842 | A | 12/2000 | Shin et al. |
| 6,171,662 | B1 | 1/2001 | Nakao |
| 6,197,669 | B1 | 3/2001 | Twu et al. |
| 6,197,694 | B1 | 3/2001 | Beinglass |
| 6,200,893 | B1 | 3/2001 | Sneh |
| 6,228,181 | B1 | 5/2001 | Yamamoto et al. |
| 6,252,295 | B1 | 6/2001 | Cote et al. |
| 6,271,054 | B1 | 8/2001 | Ballantine et al. |
| 6,326,311 | B1 | 12/2001 | Ueda et al. |
| 6,391,803 | B1 | 5/2002 | Kim et al. |
| 6,455,892 | B1 | 9/2002 | Okuno et al. |
| 6,468,924 | B2 | 10/2002 | Lee et al. |
| 6,501,121 | B1* | 12/2002 | Yu et al. ............... 257/310 |
| 6,503,846 | B1 | 1/2003 | Niimi et al. |
| 6,528,530 | B2 | 3/2003 | Zeitlin et al. |
| 6,537,910 | B1 | 3/2003 | Burke et al. |
| 6,576,558 | B1 | 6/2003 | Lin et al. |
| 6,613,695 | B2 | 9/2003 | Pomarede et al. |
| 6,638,879 | B2 | 10/2003 | Hsieh et al. |
| 6,649,968 | B2 | 11/2003 | Wolstenholme |
| 6,667,196 | B2* | 12/2003 | Yu et al. ............... 438/142 |
| 6,686,243 | B2 | 2/2004 | Jang |
| 6,724,038 | B2 | 4/2004 | Mikolajick |
| 6,831,315 | B2 | 12/2004 | Raaijmakers et al. |
| 7,033,126 | B2 | 4/2006 | Van Den Berg |
| 7,087,950 | B2 | 8/2006 | Willer et al. |
| 7,092,287 | B2 | 8/2006 | Beulens et al. |
| 2002/0047151 | A1 | 4/2002 | Kim et al. |
| 2002/0055217 | A1 | 5/2002 | Kanamori |
| 2002/0073925 | A1 | 6/2002 | Noble et al. |
| 2002/0098627 | A1 | 7/2002 | Pomarede et al. |
| 2002/0168868 | A1 | 11/2002 | Todd |
| 2002/0197831 | A1 | 12/2002 | Todd et al. |
| 2003/0017671 | A1 | 1/2003 | Lee et al. |
| 2003/0022528 | A1 | 1/2003 | Todd |
| 2003/0059535 | A1 | 3/2003 | Luo et al. |
| 2003/0082300 | A1 | 5/2003 | Todd et al. |
| 2003/0113949 | A1* | 6/2003 | Valliath ............... 438/46 |
| 2006/0043457 | A1 | 3/2006 | Baik |
| 2007/0126054 | A1 | 6/2007 | Jung |
| 2007/0210368 | A1 | 9/2007 | Cho et al. |
| 2007/0267681 | A1 | 11/2007 | Joo et al. |
| 2007/0267692 | A1 | 11/2007 | Joo et al. |
| 2009/0057744 | A1 | 3/2009 | Weimer et al. |

FOREIGN PATENT DOCUMENTS

| | | |
|---|---|---|
| JP | 57-209810 | 12/1982 |
| JP | 59-078918 | 5/1984 |
| JP | 59-078919 | 5/1984 |
| JP | 60-043485 | 3/1985 |
| JP | 61-153277 | 7/1986 |
| JP | 62-076612 | 4/1987 |
| JP | 63-003414 | 1/1988 |
| JP | 63-003463 | 1/1988 |
| JP | 01-217956 | 8/1989 |
| JP | 01-268064 | 10/1989 |
| JP | 02-155225 | 6/1990 |
| JP | 03-091239 | 4/1991 |
| JP | 03-185817 | 8/1991 |
| JP | 03-187215 | 8/1991 |
| JP | 03-292741 | 12/1991 |
| JP | 04-323834 | 11/1992 |
| JP | 05-021378 | 1/1993 |
| JP | 05-062911 | 3/1993 |
| JP | 07-249618 | 9/1995 |
| JP | 08-242006 | 9/1996 |
| KR | 10-0729364 | 6/2007 |

OTHER PUBLICATIONS

Ikoma et al., Growth of Si/3C-SiC/Si(100) hetrostructures by pulsed supersonic free jets, *Applied Physics Letters*, vol. 75, No. 25, pp. 3977-3979, Dec. 1999.

Iyer, et al., "A process Method of Silicon Nitride Atomic Layer Cyclic Deposition," Semicon Taiwan 2001, pp. 17-25.

Koga et al., "Silicon Single-Electron Memory & Logic Devices for Room Temperature Operation," *IEDM*, 143-147 (2001).

Ohba et al., "Influence of Channel Depletion on the Carrier Charging Characteristics in Si Nanocrystal Floating Gate Memory," Mar. 2000, *Jpn J Appl Phys* Part 1 (2000) vol. 39, No. 3A, pp. 989-993.

Ohba et al., "Non-Volatile Si Quantum Memory with Self-Aligned Doubly-Stacked Dots," Dec. 2000, *IEDM Technical Digest*, pp. 313-316.

Tiwari et al., "Volatile and Non-Volatile Memories in Silicon with Nano-Crystal Storage," Dec. 1995, International Electron Devices Meeting, pp. 521-524.

Wakai et al., "Ultra High Density HfO$_2$ Nanodots Memory for Scaling," *IEEE* (2006).

Watanabe, An Advanced Technique for Fabricating Hemispherical-Grained (HSG) Silicon Storage Electrodes, *Transactions on Electron Devices*, vol. 42, No. 2, Feb. 1995.

\* cited by examiner

METHOD OF FORMING COMPLEX OXIDE NANODOTS FOR A CHARGE TRAP

BACKGROUND

1. Field

This invention relates generally to charge trapping layers for electronic memory devices and, more particularly, to complex oxide nanodots and methods for forming complex oxide nanodots.

2. Description of the Related Art

The sizes of features in semiconductor memory devices are constantly being scaled down to fulfill demands for diminishing device sizes and increased memory capacity. Nonvolatile storage devices such as Flash, ROM, NROM, and other magnetic and optical disk drives are encountering scaling challenges. For example, the vertical scaling of floating gate transistors for Flash memory devices has been difficult due to problems such as charge retention failures, inter-floating gate coupling, and stress induced leakage current (SILC) losses caused by defects in the gate oxide.

As scaling has progressed, various technologies have been developed. For example, nonvolatile memory technology has used ONO ($SiO_2$/SiN/$SiO_2$) stacks for inter-poly dielectric layers. However, ONO stacks thinner than 13.0 nm can encounter charge retention failures and threshold voltage instability in some circumstances. Replacing ONO stacks with SONOS (Si/$SiO_2$/SiN/$SiO_2$/Si) dielectric layers has been one approach to realize vertical scaling for nonvolatile memory devices. The increase in programming speed and lower voltage operation provided by SONOS devices has been enabled by reducing the tunneling dielectric layer thickness. However, reducing the tunneling dielectric layer thickness can seriously degrade the charge retention capability of the device. Thus, conventional SONOS has shown intrinsically poor charge retention properties for very thin tunneling oxides of about 2 nm thick or less. The use of thicker tunneling oxides has been impractical due to parasitic gate erase currents.

Thus, there is a continuing need for new nonvolatile memory technologies.

DETAILED DESCRIPTION

Figure 1:
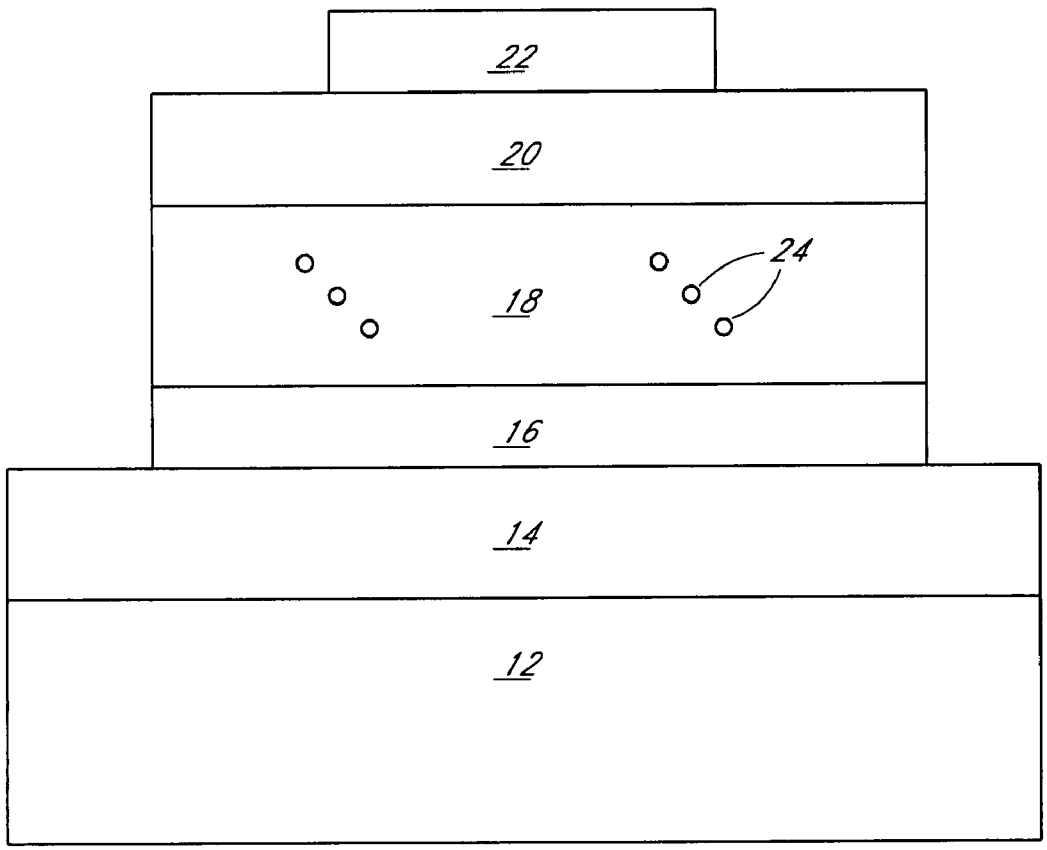
FIG. 1 shows a cross sectional view of a memory or storage device for storing charge carriers according to some embodiments of the invention.

Charge retention failure remains a concern for nonvolatile memory or storage devices. One example of a nonvolatile memory device is a Flash memory cell, which stores information in floating gate transistors. Floating gate transistors typically include an active semiconductor layer on a substrate, a tunneling dielectric layer over the semiconductor layer, a charge trapping layer over the tunneling dielectric, a barrier dielectric layer over the charge trapping layer, and a control gate over the barrier dielectric layer. The charge trapping layer is surrounded by dielectric layers so that it is electrically "floating" while storing charges. Charge retention failures can occur because charge retention capability is sensitive to defects in the tunneling dielectric layer. Defects that are present in the tunneling dielectric layer can allow charges to leak from a floating gate transistor. Thus, further scaling of devices by reducing the thickness of the tunnel dielectric layer can increase the risk of defects in the tunneling dielectric layer and accordingly decrease charge retention capabilities of the charge trapping layer.

One solution to the above problem is to store charges in a charge trapping layer comprising a plurality of nanodots (e.g., quantum dots), instead of a monolithic floating gate (e.g., a continuous layer of material). A nanodot is distinguished from a single monolithic layer of material in that the nanodot is physically confined in three dimensions. Accordingly, when a defect is present, a nanodot immediately adjacent to the defect might lose its charge but the other nanodots would not be affected. Nanodots are thus discrete charge traps that can reduce the sensitivity of the device to incidental defects in the tunnel oxide, and provide higher overall reliability for memory devices.

Embodiments of the invention provide dielectrics having superior charge retention capabilities. In particular, it has been found that materials having the general formula $ABO_3$, where A and B are metals and O is oxygen, or having a "perovskite structure," may be used to form charge trapping layers with excellent charge retention properties. Some embodiments of the invention are complex oxide layers exhibiting superior charge retention by way of traps in their crystal structure that minimize the leaking of charges. Some embodiments of the invention provide localized charge storage sites using discrete nanodots, quantum dots, nuclei, crystals, crystallites or particles (hereinafter "nanodots") formed by complex oxides.

Embodiments of the invention may form the above complex oxides by processes that alternately expose a substrate to pulses of materials that are separated in time. Process conditions according to some embodiments are established such that discontinuous nanodots are formed. According to other embodiments, process conditions are established such that a continuous layer having a perovskite structure is formed.

Reference will now be made to the Figures, wherein like numerals refer to like parts throughout. It will be appreciated that the Figures are not necessarily drawn to scale.

FIG. 1 shows a cross section of a memory or storage device 10 with a floating gate transistor including a plurality of nanodots according to embodiments of the invention. Substrate 12 may be an insulator such as silicon-on-insulator ("SOI") where the insulator is silicon dioxide. However, substrate 12 may be formed of various materials known in the art, including but not limited to silicon, silica, coated silicon, germanium, silicon-germanium alloys, copper metal, noble and platinum metals group including silver, gold, platinum, palladium, rhodium, iridium and ruthenium, various nitrides, such as transition metal nitrides (e.g., tantalum nitride TaN), various carbides, such as transition metal carbides (e.g., tungsten carbide WC), and nitride carbides (e.g., tungsten nitride carbide $WN_xC_y$).

A semiconductor layer 14 lies over the substrate and may be formed by methods known in the art. Semiconductor layer 14 may be formed of any semiconductor material, including but not limited to silicon, silicon germanium, germanium, silicon carbide, gallium arsenide, indium arsenide or other Column IV, III-V and II-VI elements forming semiconductor alloys as known in the art. The semiconductor layer 14 over substrate 12 is typically patterned with drain, source and channel regions (not shown).

A floating gate transistor is formed by the tunneling dielectric layer 16, charge trapping layer 18 and barrier dielectric layer 20 over semiconductor layer 14. Charge trapping layer 16 lies between the tunneling dielectric 16 and the barrier layer 20 so that it is electrically "floating" while coupled to control voltages, typically by capacitors. The tunneling dielectric 16 and barrier dielectric 20 layers may be, for example, silicon dioxide, silicon nitride, calcium fluoride, and may have a thickness in the range of about 1-5 nm. The charges stored in the charge trapping layer may be modified by applying voltages to the control gate 22 that lies over the barrier dielectric 20. The control gate 22 may be formed of polysilicon or other semiconductor materials as known in the art. The charge trapping layer 18 of FIG. 1 may include a plurality of nanodots 24 that trap charge carriers. Methods for forming the charge trapping layer 18 and nanodots 24 are provided in further detail herein.

The nanodots 24 of the charge trapping layer 18 of FIG. 1 may be formed by ALD-type methods. In the context of the embodiments disclosed herein, an "ALD-type process" refers to a process for forming discontinuous or continuous layers or thin films over a substrate by exposing the substrate to pulses of molecular precursors that are alternately introduced, or separated in time. It will be appreciated that in some embodiments of the invention, precursors may self-limitingly deposit about one monolayer of material at nucleation locations on a substrate surface. However, the deposition may not be self-limiting, and more or less than a monolayer may be deposited per pulse. Gas phase reactions between precursors and undesired reactions of by-products may be inhibited in ALD-type depositions because material pulses are separated from each other by time. In addition, surplus vapor phase reactants and reaction by-products may be removed from the chamber between material pulses, e.g., by purging the chamber and/or evacuating the chamber.

In the context of the present application "a reaction space" generally designates a reactor or a reaction chamber in which the conditions may be adjusted so that deposition of a thin film is possible. In the context of the present application, "an ALD type" reaction space generally means a reactor or a reaction chamber in fluid communication with precursor sources that may be pulsed in temporally-separated pulses, and the temperature and pressure of the reaction space and the flow rates of gases may be adjusted to a range that makes it possible to grow thin films or layers. The ALD type reaction space can be various single substrate and batch reactors or reaction chambers known in the art.

"Source material" and "precursor" are used interchangeably to designate a metal material that may be used as a starting material for the corresponding deposited metal oxide. Reactants may include "precursors" (which leave a component of a deposited material), but may also include, e.g., any material that chemically reacts with a source material or a deposited material. The term "multicomponent oxide" includes oxide materials containing at least two different metals.

According to embodiments of the invention, multicomponent oxide nanodots are formed by feeding temporally-separated pulses of various precursors into a reaction space. Metal source materials may be introduced in an ALD-type process, including metal halides, preferably fluorides, chlorides, bromides or iodides, or metal organic compounds, preferably amide, imide, diorganoamide, alkoxy, alkylamino, cyclopentadienyl, dithiocarbamate, betadiketiminate or betadiketonate compounds of the desired metal(s), or combinations thereof. An oxygen source material may be fed into the reaction space in pulses that are temporally separated from pulses of the metal source materials. Examples of oxygen source materials include, without limitation, water, oxygen, hydrogen peroxide, aqueous solution of hydrogen peroxide, ozone, oxides of nitrogen, halide-oxygen compounds, peracids (—O—O—H), alcohols, alkoxides, oxygen-containing radicals and mixtures thereof.

According to embodiments of the invention, a first metal may be deposited and exposed to an oxidant, and a second metal may then be deposited and exposed to an oxidant. The second metal may be exposed to the same or a different oxidant as the first metal source precursor. The resulting multicomponent oxide may include Bi, Ca, Sr, Cu, Ti, Ta, Zr, Hf, V, Nb, Cr, W, Mo, Al, Si, Ba, La, Mg, Nb and/or Pb oxide(s).

Figure 2A:
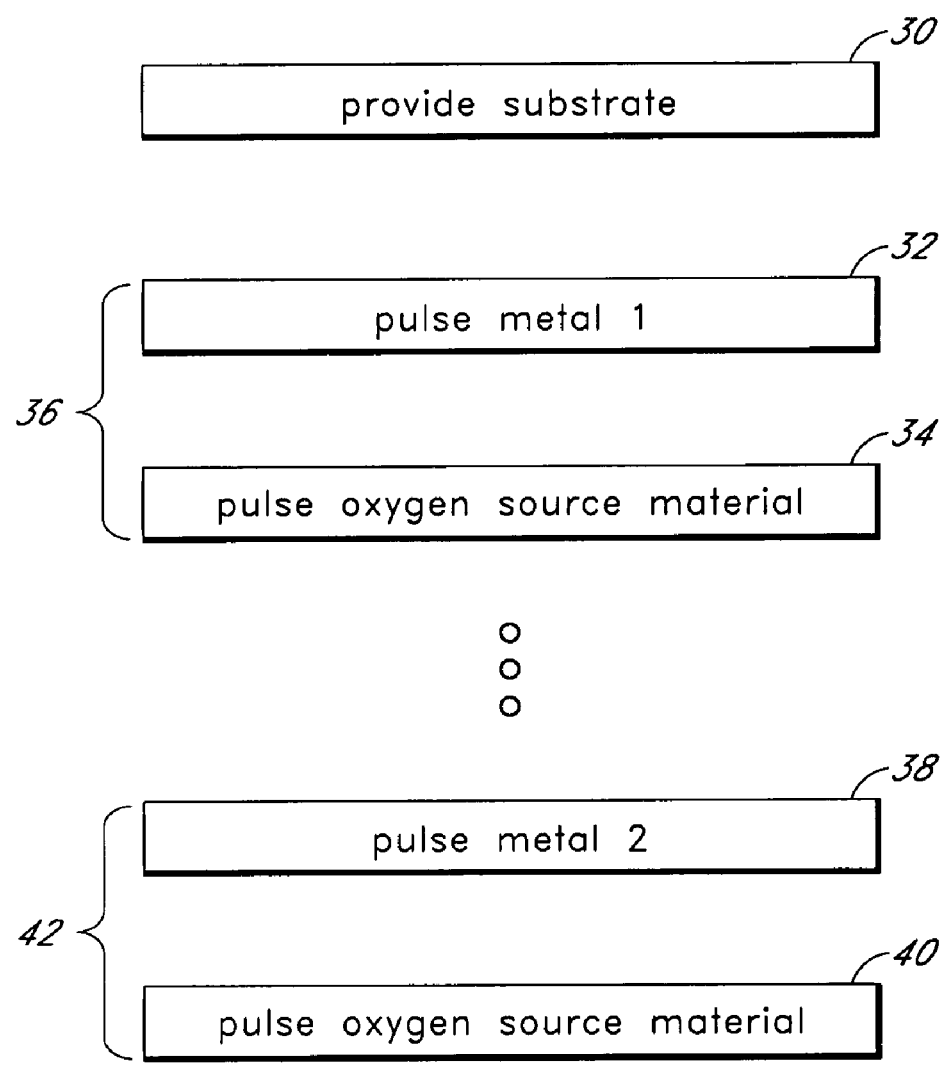
FIG. 2A shows a sequence of process steps to form a charge trapping layer according to some embodiments of the invention.

A sequence of process steps to form the nanodots 24 of FIG. 1 is schematically shown in FIG. 2A, according to embodiments of the invention. In step 30, a substrate, such as a silicon substrate or any other substrate as noted above, is provided in a reaction space, such as in an ALD-type reactor. The substrate is exposed to a pulse of first metal precursor ("metal 1") that is introduced into the reaction space in step 32. The substrate is then exposed to a pulse of an oxygen source material which may form an oxide (e.g., a material formed of metal 1 and oxygen) with the first metal source material, in step 34. Pulses of the first metal and oxygen source materials are temporally separated to expose the substrate to these precursors at different times. A sequence of temporally-separated exposures of the substrate to the first metal precursor and oxygen constitutes a first metal cycle 36 that may be repeated. A desired number of cycles may be performed. According to some embodiments of the invention, the first metal oxide forms a discontinuous material after several cycles of the above steps.

The substrate with the oxide of the first metal may then be exposed to a pulse of a second metal precursor ("metal 2") introduced into the reaction space in step 38, and then subsequently to a pulse of an oxygen source material capable of forming an oxide with the second metal source material, in step 40. As with the first metal, pulses of the second metal and oxygen source materials are temporally separated so that the substrate is exposed to the second metal and oxygen sources in the reaction space at different times. The temporally-separated exposure to the second metal precursor and oxygen may constitute a second metal cycle 42 that is repeated. As with the first metal oxide, the second metal oxide also may remain discontinuous after several cycles of the above steps.

The nanodots 24 of FIG. 1 formed by the steps above may be a multicomponent oxide having, for example, a "perovskite structure" (e.g., $ABO_3$). According to an embodiment of the invention, the nanodots 24 are formed of strontium titanate, $SrTiO_3$ ("STO"), having a perovskite structure. As noted above, the charge trapping layer 18 may include the embedded nanodots 24, which capture and store charge carriers (e.g., electrons or electron holes) passing through the underlying tunneling dielectric layer 16 and into the charge trapping layer 18. According to embodiments of the invention, the STO nanodots may be in a range of about 0.4 nm to about 100 nm in their longest dimension. According to certain embodiments, the STO nanodots may be between about 10 nm to about 100 nm in diameter. According to other embodiments, the STO nanodots may be between about 5 nm to about 50 nm in diameter. According to other embodiments, the STO nanodots may be between about 0.4 nm to about 10 nm in diameter. In some embodiments, the nanodots can have a density in the range of about $1\times10^{11}/cm^2$ to about $1\times10^{14}/cm^2$.

Advantageously, STO has been found to have a very high dielectric constant (~300) and to provide superior charge storage capability at low voltages for memory devices. Moreover, STO nanodots and layers formed by methods disclosed herein are useful for trapping charges due to their energy band characteristics. The band offset of STO to silicon impacts STO's usefulness for memory applications, since materials with larger barrier heights can prevent charges from leaking out of the material, assuming that the material erases at reasonable voltages. The STO band offset from the valence band of silicon is about 0.1 eV and from the conduction band of silicon is about 2.3 eV. Additional band offsets may be provided by the STO material from, for example, vacancies in the STO crystal structure. O and Ti vacancies are about 0.4-0.9 eV from the conduction band of STO. The combination of the above offsets to the bandgap of silicon could provide fairly deep charge traps having a total barrier height in the range of about 2-4 eV. While the invention is not limited by theory, the increased barrier height provided by the STO or perovskite materials as formed by methods disclosed herein may provide good charge retention capabilities for storage devices.

Various source materials may be used in the production of the STO nanodots in ALD-type reactors. One example of a precursor is $Sr(C_{11}H_{19}O_2)_2$, otherwise known as $Sr(THD)_2$ ("strontium tetramethylheptanedionate"). Another example is $Ti(C_6H_{12}O_2)(C_{11}H_{19}O_2)_2$, otherwise known as Ti(MPD)(THD)$_2$ ("titanium methylpentanedione tetramethylheptanedionate").

Without intending to be limited by theory, the inventors believe that the formation of nanodots by ALD-type processes occurs as follows. The surfaces of substrates are susceptible to slow nucleation behavior during the first stages of deposition. Accordingly, in the first stages of growth, the atoms deposited on a substrate do not form a continuous layer, but instead form a number of discrete nuclei, while leaving the surrounding surface area of the substrate uncovered. During the nucleation stage, nuclei continue to grow in size into larger particles, and additional new nuclei are formed by reactants binding to the surface. When the process continues until the nuclei touch each other to eventually cover the entire surface area, a continuous layer is formed.

When suitable process conditions are chosen in terms of partial pressures and process temperatures, and the process is interrupted in time, a discontinuous material with a given density and size of nuclei that is suitable as a nanodot may be formed. Accordingly, the processes may be halted while the depositing material is still discontinuous and has a desired density and size of nanodots (that are spaced apart from one another). According to other embodiments, the processes may be continued to past the point at which the deposited material becomes a continuous layer and covers the entire surface area.

According to some embodiments, the STO is formed by first forming a titanium dioxide directly on a substrate, and according to other embodiments, the STO is formed by first forming a strontium oxide directly on a substrate. Without being limited by theory, the inventors believe that titanium tends to nucleate on a substrate more easily than strontium. Accordingly, nucleating titanium on a substrate first would tend to more easily form a continuous STO layer over the entire substrate, while nucleating strontium on a substrate first would tend to more easily form discontinuous STO. Thus, in some embodiments, the choice of forming SrO or TiO$_2$ first on the substrate would depend on whether a continuous or discontinuous material is desired, and on the density and size of nanodots desired for a particular application.

While described with reference to STO for ease of illustration and discussion, the charge trapping layer in the floating gate transistor may also be formed of or include materials other than STO, including other multicomponent oxides. As noted above, multicomponent oxides may take the form of other perovskite structures, which include materials having the general formula ABO$_3$. The perovskite structure is adopted by many complex oxides and generally tends to grow in a closely packed array. The perovskite structure consists of a general cubic crystal structure, with the A cation in the corner of a cube, B cations in the middle, and the oxygen anion in the center of the face edges. However, embodiments disclosed herein may utilize disordered forms of perovskite that include many defects in the crystal structure, such as vacancies and interstitials. While perovksites may be stabilized by the coordination of the A cation in the above cubic structure, complex perovskites may provide various different A site cations, which may enhance disordering of the crystal structure, and accordingly provide more sites for trapping charges in the form of vacancies. Thus, even for thin continuous layers without nanodots, certain complex oxides, e.g., such as those adopting perovskite structures, can provide superior charge trapping capabilities.

Examples of materials having the perovskite structure, besides STO, include but are not limited to BaTiO$_3$ (doped with Sr, Zr, Pb, La, Bi), the Pb(Mg$_{1/3}$Nb$_{2/3}$)O$_3$ family, the SrBi$_2$Ta$_2$O$_9$ ("strontium bismuth tantalate") family, the Ta$_2$O$_5$(Nb) family, and other "ABO$_3$" structures as known in the art. Moreover, these materials may additionally be doped with Ba, Zr, Pb, La or Bi.

According to embodiments of the invention, cycles 36 and 42 may be alternately repeated until a multicomponent oxide of metal 1 and metal 2 having a desired thickness is obtained. During cycle 42, the second metal oxide may integrate into the underlying disordered lattice of the first metal oxide formed after cycle 36 and form a complex oxide crystal structure. The combined cycles 36 and 42 may be employed to form an oxide that is discontinuous after several cycles, or may be repeated until a continuous oxide layer is formed.

Figure 2B:
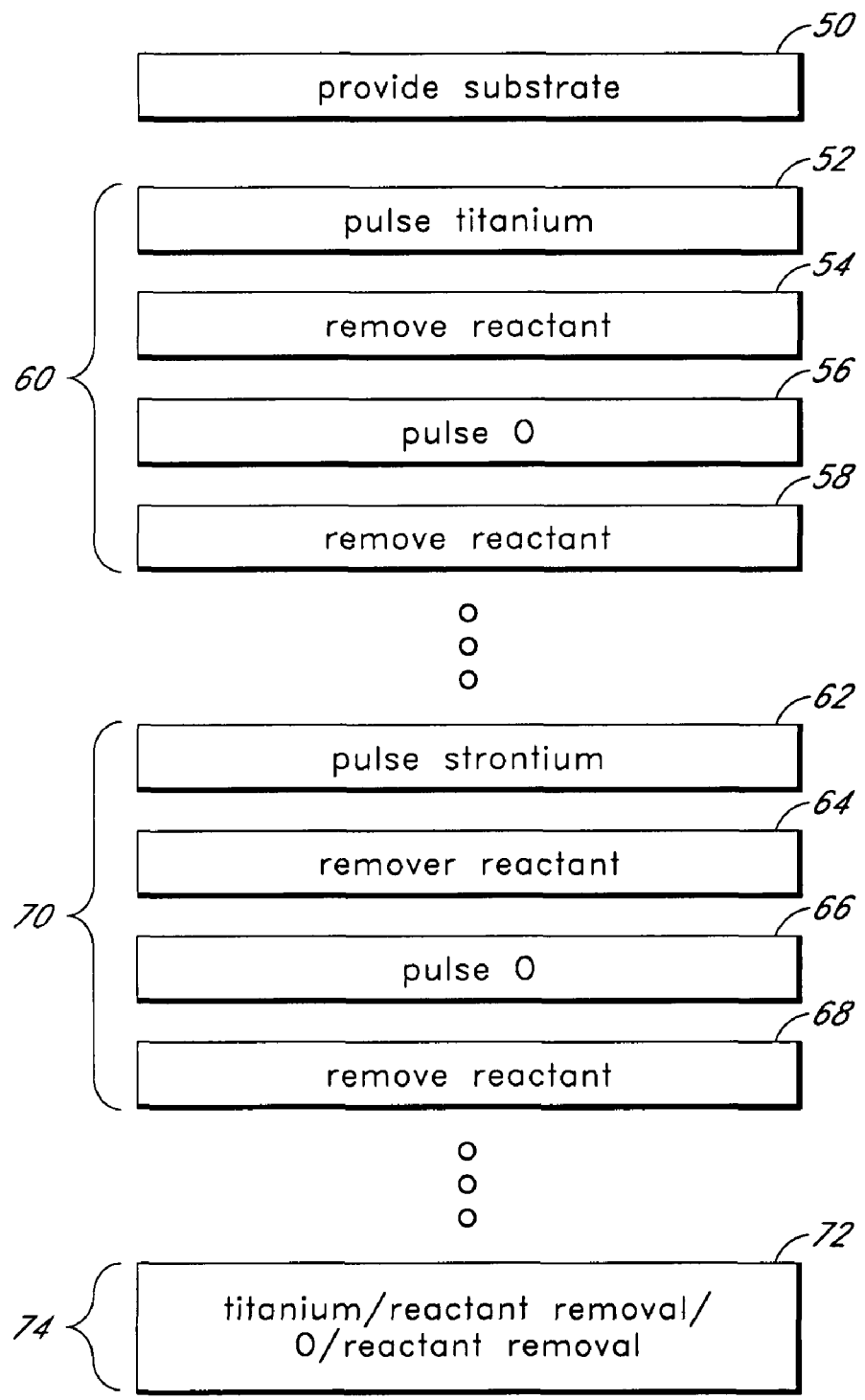
FIG. 2B shows a sequence of process steps to form a charge trapping layer according to some other embodiments of the invention.

A sequence of process steps to form the nanodots 24 in the charge trapping layer 18 of FIG. 1 is schematically shown in FIG. 2B. In step 50, a substrate, such as a silicon substrate or any other substrate as noted above, is first provided in a reaction space, such as an ALD reactor. Providing a substrate in step 50 includes providing a substrate with a single crystal semiconductor layer already formed thereon and patterned into device features, along with other oxides underlying the charge trapping layer. The preceding deposited material forms the surface for the next deposited material, and according to the illustrated embodiment, the material preceding the charge trapping layer 18 is the tunneling dielectric.

In step 52, a titanium-containing oxide, such as TiO$_2$, is formed over the tunneling dielectric layer. The TiO$_2$ may be formed by introducing a titanium precursor pulse such as Ti(MPD)(THD)$_2$ into the ALD reactor. According to an embodiment, tetrahydrofluran (THF) may be used to flush the precursor lines before and after flowing the titanium precursor. The titanium atoms attach to the surface of the substrate and form discrete nuclei or sites for nanodots, according to one embodiment of the invention. In order to convert the adsorbed titanium precursor into a titanium-containing oxide, the reactor may be evacuated and/or purged with an inactive gas in step 54 to prevent gas phase reactions between different precursors. The inactive gas may be argon, but other gases such as nitrogen or other inert gases as known in the art may be used. After purging the reaction space, a pulse of an oxygen source material may be introduced into the reactor in step 56 to react with the titanium. In the illustrated embodiment, the oxygen source is ozone ($O_3$).

In step 58, reactant is removed from the reaction space by evacuation and/or purging with a purge gas such as argon. After one "titanium cycle" is completed, a thin discontinuous compound titanium-containing oxide is deposited on the substrate. The titanium cycle may be repeated a desired number of times until a continuous or discontinuous compound of a desired thickness is reached. For example, the formation of the initial titanium-containing oxide 54 of FIG. 1 may include employing 9 consecutive titanium cycles of the above steps (Ti(MPD)(THD)$_2$→Ar→$O_3$→Ar). It has been found that about 9 consecutive titanium cycles of the above steps form a stoichiometric ratio of titanium and oxygen in titanium dioxide ($TiO_2$). More than about 9 consecutive titanium cycles would then form a titanium-rich titanium dioxide.

In step 62, a strontium source such as Sr(THD)$_2$ is introduced to deposit strontium over the first titanium dioxide on the substrate. According to an embodiment, tetrahydrofluran (THF) may be used to flush the precursor lines before and after flowing the strontium precursor. Steps 62, 64, 66, 68 for forming the initial strontium-containing oxide generally follow the above steps 52, 54, 56, 58 for forming the $TiO_2$. That is, in step 64, the strontium precursor is removed from the reaction space by evacuation and/or purging the reaction space with an inactive gas such as argon, and in step 66, a vapor phase pulse of an oxygen source material such as ozone ($O_3$) is introduced into the reactor to react with the strontium. In step 68, evacuation and/or purging of the reaction space is again performed to remove reactant from the reaction space. In step 70, the above "strontium cycle" (Sr(THD)$_2$→Ar→$O_3$→Ar) is repeated consecutively 2 more times to form the strontium-containing oxide 18 of FIG. 1. It has also been found that about 3 consecutive strontium cycles of the above steps form a stoichiometric ratio of strontium and oxygen in strontium oxide (SrO). More than about 3 consecutive strontium cycles would then form a strontium-rich strontium oxide.

The 9 consecutive titanium cycles to form the titanium dioxide and the 3 consecutive strontium cycles to form the strontium oxide in combination constitute one "set" of titanium and strontium cycles. Each set of cycles to form the titanium dioxide and the strontium oxide is repeated n times, until n stacks of alternating $TiO_2$/SrO are formed. That is, a first set includes 9 consecutively repeated titanium cycles of titanium precursor, inactive gas, oxygen source and inactive gas, forming titanium dioxide, and subsequently, 3 consecutively repeated strontium cycles of strontium precursor, inactive gas, oxygen source and inactive gas, forming strontium oxide. A second set repeats the above 9-titanium-cycle process to form titanium dioxide, and the strontium 3-strontium-cycle process to form strontium oxide. This set is repeated until the n$^{th}$ set of the above alternating $TiO_2$/SrO processes ends the sequence. A $TiO_2$ capping layer 38 may be formed after the n set by employing 9 more titanium cycles, as shown in step 72 of FIG. 2B. However, step 72 may also be 3 strontium cycles to form an SrO capping layer after the n$^{th}$ set, according to alternative embodiments. In other embodiments still, step 72 may be omitted altogether.

In some embodiments, in which titanium and strontium are fed into an ALD-type reactor in temporally-separated pulses as shown in FIG. 2B, the titanium pulse may be between about 40-60 seconds at a flow of about 0.8 mL/min, the strontium pulse may be between about 30-60 seconds at a flow rate of about 0.8 mL/min, the ozone pulse may be between about 30-60 seconds at a flow rate of about 10 slm (standard liters per min), at a concentration of 200 g/Nm$^3$, and the argon purge may be between about 15-30 sec at a flow rate of about 0.4-1.0 mL/min. One titanium cycle may include about 60 seconds of titanium pulse, 30 seconds of purge, 30 seconds of $O_3$ pulse, and 20 seconds of purge. One strontium cycle may include about 30 seconds of strontium pulse, 30 seconds of purge, 30 seconds of $O_3$ pulse, and 20 seconds of purge.

According to an embodiment of the invention, the pressure in the reactor is in the range of about 1-2 Torr. The process temperature during the formation of the nanodots may be between about 300° C. and about 325° C.

Figure 3:
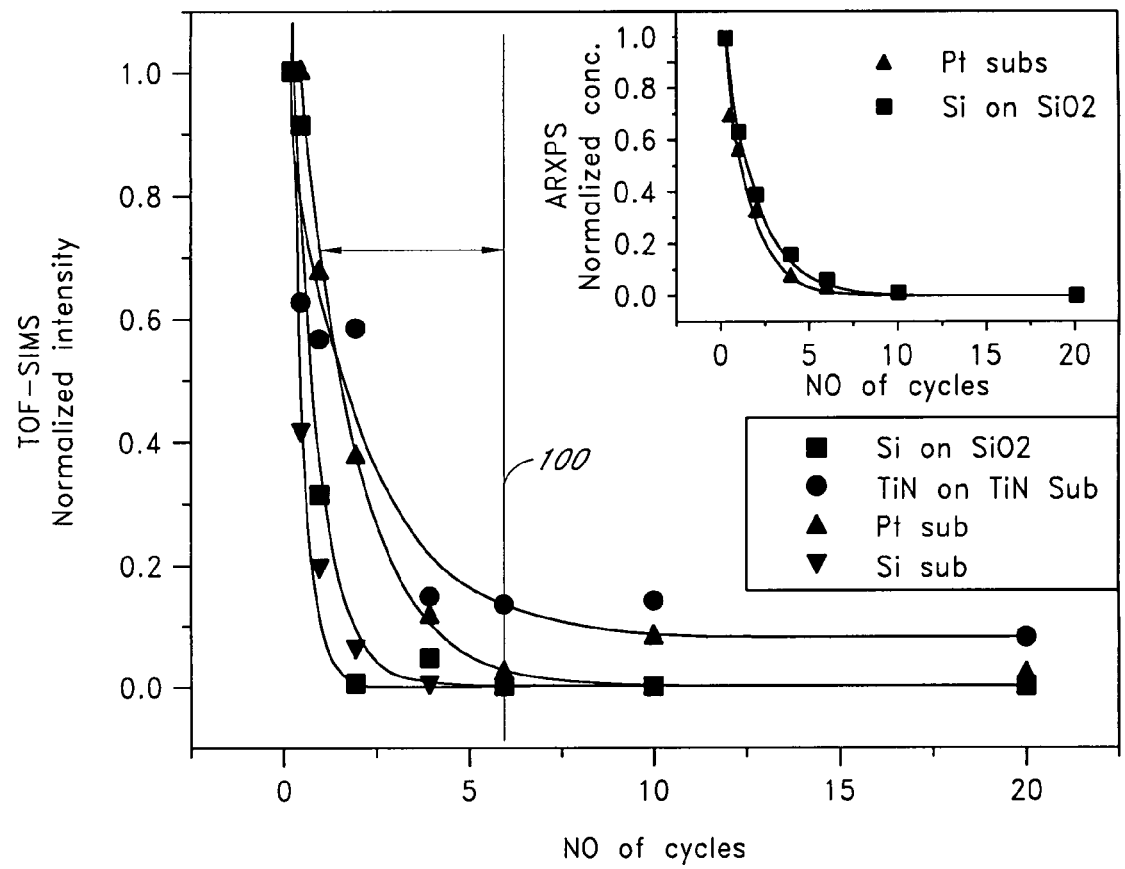
FIG. 3 illustrates a TOF-SIMS plot of intensity vs. number of cycle sets for depositions according to some embodiments of the invention.

According to the embodiment described in FIG. 2B, the alternating $TiO_2$/SrO processes form an STO layer with a general cubic perovskite structure. As noted above, the resulting deposited STO form discrete STO nanodots and particles according to some embodiments, or form a thin, continuous STO layer according to other embodiments. As noted above, nanodot formation starts when atoms are first adsorbed on a substrate during the initial nucleation period, and grow as more deposition cycles are performed. The processes described above with respect to FIGS. 2A-2B for forming STO nanodots or STO layers may include between about 1-20 sets of the above alternating sets of cycles. For example, FIG. 3 illustrates a TOF-SIMS plot of secondary ion intensity vs. number of sets of cycles in accordance with an embodiment. As shown, STO was deposited by performing up to 20 of the above sets of cycles (each set having, e.g., 9 consecutive titanium cycles followed by 3 consecutive strontium cycles) on an SOI substrate, TiN substrate, Pt substrate and crystalline silicon substrate. The line 100 in FIG. 3 shows the point at which a continuous layer is formed, so that the cycles to the left of line 100 roughly corresponded with formation of discontinuous nanodots, and the cycles to the right of line 100 corresponded with formation of a continuous layer.

Line 100 is shown to lie at about 6 sets of cycles to form titanium dioxide alternating with strontium oxide. Although the highest density of nanodots occur between 1-6 cycles according to FIG. 3, it is also believed that some discontinuities are present in mostly continuous layers formed after the 6$^{th}$ cycle, for example, from 6-10 cycles.

As noted above, the deposited STO may be discontinuous, and the methods for forming the STO as detailed above include terminating the pulses of metal and oxygen sources before a continuous layer is formed. Thus, according to FIG. 3, some embodiments may include employing between 2-6 sets of the above alternating cycles for forming titanium dioxide and strontium oxide. However, the STO may also be a continuous layer, and thus may be formed by employing more than 6 sets of the above alternating cycles. In one embodiment, the alternating cycles are terminated immediately after the point of continuity to the right of line 100.

Figure 4A:
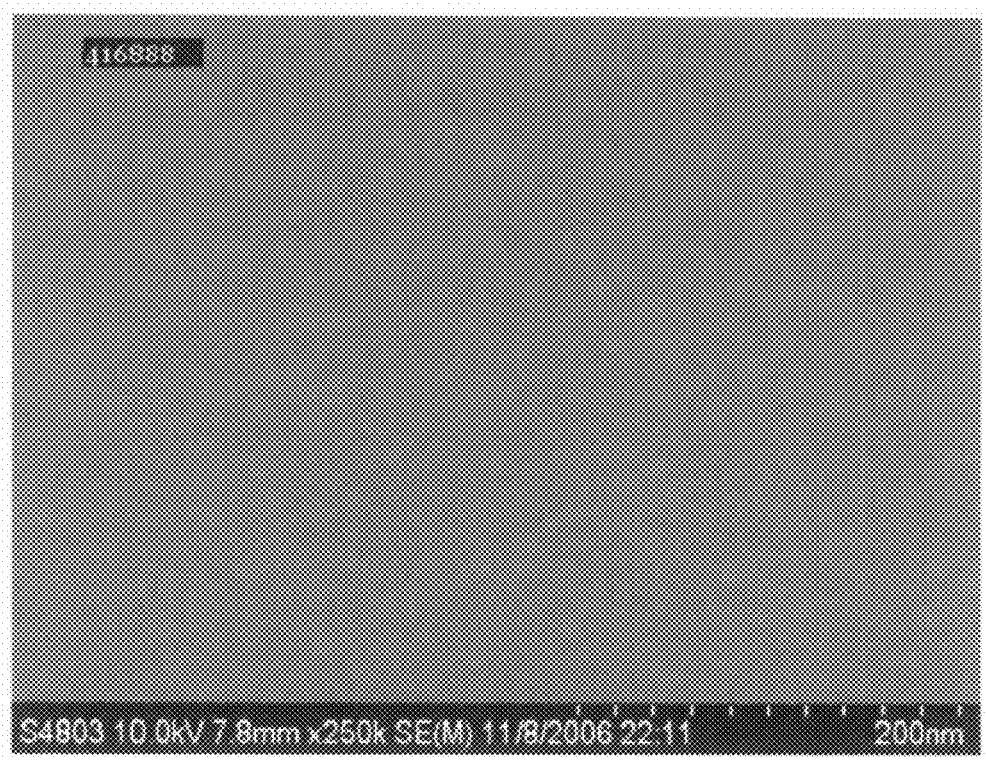
FIG. 4A-4D show TEM micrographs of substrates on which STO nanodots are formed according to some embodiments of the invention.
Figure 4B:
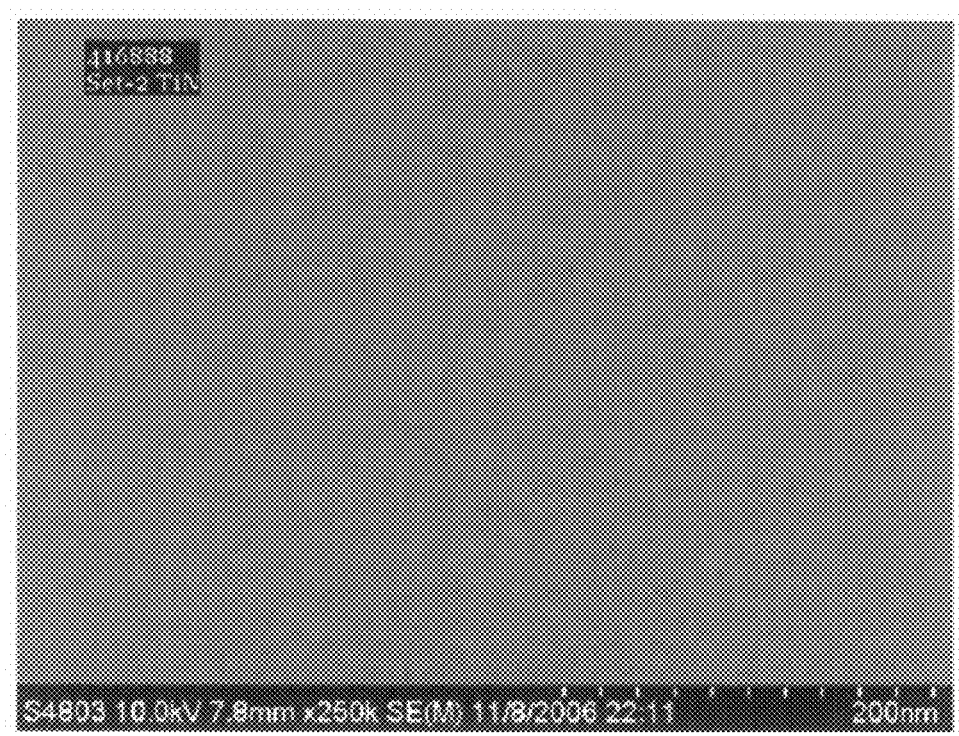

FIGS. 4A-4D show TEM micrographs of STO layers. In particular, FIG. 4A shows STO formed on a TiN substrate by methods disclosed above. According to the STO layer shown in FIG. 4A, the particles or nanodots of STO are shown in light and appear uniformly sized, about 5 nm to about 20 nm. The STO nanodots also appear to be evenly distributed throughout the substrate, and are shown to cover the entire surface area of the TEM sample. FIG. 4B shows a layer of STO formed on a TiN substrate after 2 sets of titanium and strontium cycles. The STO nanodots appear to be about the same size as in FIG. 4A, about 50 nm to about 100 nm, and also appear uniformly sized and evenly distributed throughout the entire surface area on the TiN substrate.

Figure 4C:
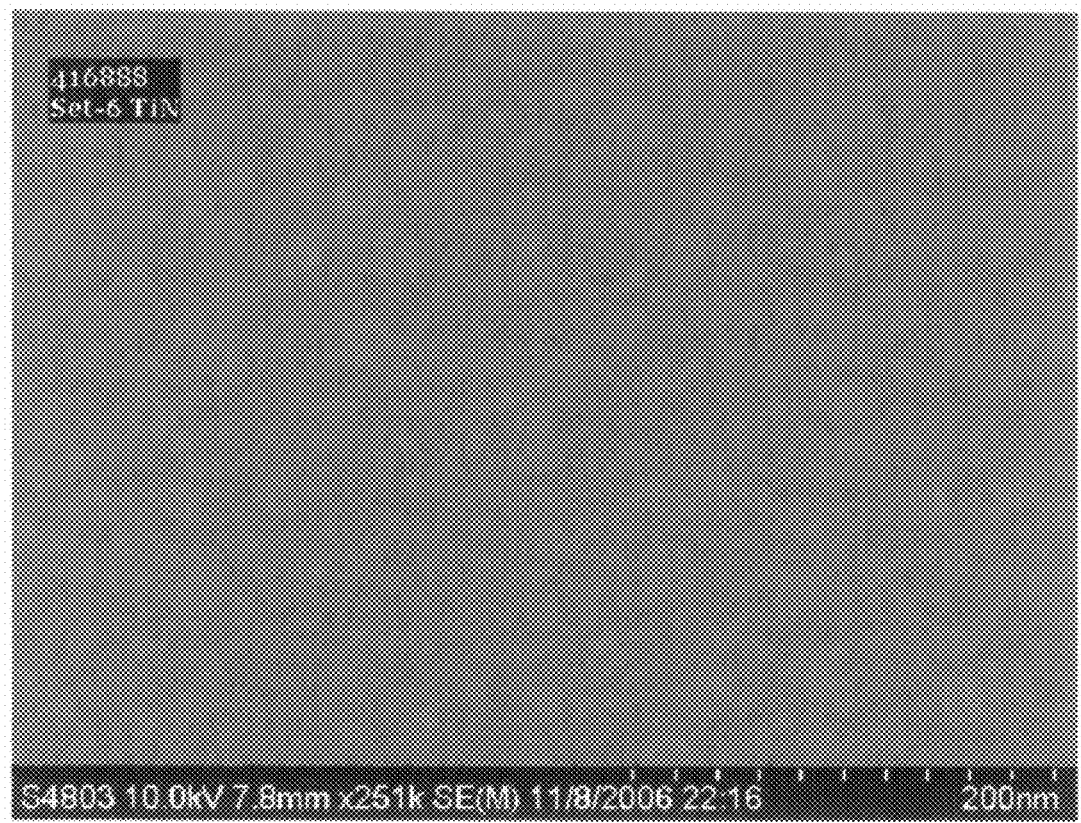

FIG. 4C shows STO nanodots formed on a TiN substrate after 6 sets of titanium and strontium cycles. The STO nanodots are in the range of about 5 nm to about 20 nm and are shown to have grown in size. Since FIG. 4C shows STO nanodots after 6 sets of cycles of the above disclosed ALD processes, in contrast to the 2 sets of cycles for the embodiment shown in FIG. 4B, the larger particle size of the STO nanodots seems to indicate impingement of atomic clusters and growth towards a continuous layer of STO. Accordingly, a lower total number of discrete particles is apparent in FIG. 4C than in FIG. 4B. However, FIG. 4C also shows that even with lower overall density, the particles are fairly uniform in size and evenly distributed throughout the substrate.

Figure 4D:

FIG. 4D shows STO nanodots formed on a Pt substrate after 2 sets of titanium and strontium cycles. The particle size of the STO nanodots is shown to be about 30 nm to about 80 nm, which is larger on the Pt substrate than on the TiN substrate after 2 sets of cycles, as shown in FIG. 4B. As for the other figures, the nanodots in FIG. 4D also appear to be uniformly sized and evenly distributed over the surface.

Given the high density of nanodots, the deposited STO shown in FIGS. 4A-4C all formed discontinuous material, a result consistent with the process conditions for the samples of FIGS. 4A-4C which all included deposition of STO by 6 sets of cycles or less. The discontinuous surfaces shown in FIGS. 4A-4C indicate that the STO observed contained a very high density of localized traps that would provide superior charge trapping capabilities. In all figures, small nanodots in the range of about 5 nm to about 40 nm are apparent. Although the average particle and nanodot size differed for all FIGS. 4A-4C, the consistent uniformity of size and distribution of nanodots for all illustrated embodiments indicate a high level of process control and tunability for the methods disclosed herein. Embodiments of the methods disclosed above is illustrated in the following Example, which provides an example of an embodiment of the invention and is not meant to limit the disclosure.

Example

A silicon wafer was loaded into a vertical furnace for ALD processing from Tokyo Electron Ltd. of Japan. STO growth was carried out at temperatures in the range from 300 to 325° C. and pressure in the range of about 1-2 Torr. A first metal cycle included flushing the precursor line with THF, pulsing $Ti(MPD)(thd)_2$ into the reactor for 60 seconds, flushing the precursor line with THF, evacuating the reactor, purging the substrate with Ar for 30 seconds, pulsing $O_3$ into the reactor for 30 seconds, evacuating the reactor and subsequently purging the substrate with Ar for 20 seconds. A second metal cycle included flushing the precursor line with THF, pulsing $Sr(THD)_2$ into the reactor for 30 seconds, flushing the precursor line with THF, reducing the pressure in the reactor to vacuum, purging the substrate with Ar for 30 seconds, pulsing $O_3$ into the reactor for 30 seconds, reducing the pressure in the reactor to vacuum, and subsequently purging the substrate with Ar for 30 seconds. The first titanium cycle was repeated 9 times, followed by a second strontium cycle repeated 3 times, to complete one set of $TiO_2/SrO$ cycles. 20 sets of $TiO_2/SrO$ cycles were employed in total.

Accordingly, in some embodiments, an improved charge trapping layer having a high dielectric constant and a plurality of evenly distributed and uniformly sized nanodots may be formed by the methods disclosed herein. As a result, superior charge retention capabilities may be achieved for applications such as floating gate transistors in memory or storage devices.

Thus, in one embodiment, a method for forming a charge trap on a substrate in a reaction space is provided. The method includes exposing the substrate to temporally-separated pulses of a titanium source material, a strontium source material, and an oxygen source material capable of forming an oxide with the titanium source material and the strontium source material to form a charge trap on the substrate.

In another embodiment, a method for forming a charge trap for a memory device is provided. The method includes alternately exposing the substrate to pulses of a first metal source material and a first oxygen source material. The substrate is also alternately exposed to a second metal source material and a second oxygen source material. The metals from the first and second metal source materials form a perovskite layer with oxygen from the first and the second oxygen source materials.

In another embodiment, a device having a memory cell is provided. The memory cell includes an active area formed of a semiconductor material, a first dielectric layer over the semiconductor material, a second dielectric layer comprising a material having a perovskite structure over the first dielectric layer; a third dielectric layer over the second dielectric layer, and a gate electrode over the second third dielectric layer.

It will be appreciated by those skilled in the art that various other omissions, additions and modifications may be made to the methods and structures described above without departing from the scope of the invention.

What is claimed is:

1. A method comprising:
   forming spaced-apart nanodots over a substrate by exposing the substrate in a reaction space to pulses of a titanium source material, a strontium source material, an oxygen source material capable of forming an oxide with the titanium source material, and an oxygen source material capable of forming an oxide with the strontium source material to form a charge trap of a memory cell on the substrate,
   wherein the pulses are separated from one another in time.

2. A method comprising:
   exposing a substrate in a reaction space to temporally-separated pulses of a titanium source material, a strontium source material, an oxygen source material capable of forming an oxide with the titanium source material, and an oxygen source material capable of forming an oxide with the strontium source material to form a charge trap of a memory cell on the substrate,
   wherein each pulse of the titanium source material is followed by a pulse of the oxygen source material capable of forming an oxide with the titanium source material and wherein each pulse of the strontium source material is followed by a pulse of the oxygen source material capable of forming an oxide with the strontium source material.

3. A method comprising:
   exposing a substrate in a reaction space to temporally-separated pulses of a titanium source material, a strontium source material, an oxygen source material capable of forming an oxide with the titanium source material, and an oxygen source material capable of forming an oxide with the strontium source material to form a charge trap of a memory cell on the substrate, and
   purging the reaction space with an inactive gas between the pulses of the titanium source material, the oxygen source material capable of forming an oxide with the titanium source material, the strontium source material, and the oxygen source material capable of forming an oxide with the strontium source material.

4. The method according to claim 1, wherein the substrate is exposed to the titanium source material first before exposure to the pulses of the strontium source material.

5. The method according to claim 1, wherein the substrate is exposed to the strontium source material first before exposure to the pulses of the titanium source material.

6. A method comprising:
exposing a substrate in a reaction space to temporally-separated pulses of a titanium source material, a strontium source material, an oxygen source material capable of forming an oxide with the titanium source material, and an oxygen source material capable of forming an oxide with the strontium source material to form a charge trap of a memory cell on the substrate,
wherein the pulses are arranged in one or more titanium cycles and one or more strontium cycles, wherein each titanium cycle comprises a pulse of the titanium source material followed by a pulse of the oxygen source material, and each strontium cycle comprises a pulse of the strontium source material followed by a pulse of the oxygen source material.

7. The method according to claim 6, wherein a ratio of titanium cycles to strontium cycles is about 3:1.

8. The method according to claim 7, wherein exposing the substrate comprises performing between about 1 to about 10 sets of cycles, wherein each set comprises performing 9 consecutive titanium cycles and 3 consecutive strontium cycles.

9. The method according to claim 8, wherein the 9 consecutive titanium cycles are performed before the 3 consecutive strontium cycles.

10. The method according to claim 8, wherein the 3 consecutive strontium cycles are performed before the 9 consecutive titanium cycles.

11. The method according to claim 8, wherein the pulses form strontium titanate (STO).

12. The method according to claim 11, further comprising terminating the pulses after 9 consecutive titanium cycles to form a $TiO_2$ cap.

13. The method according to claim 11, further comprising terminating the pulses before a continuous STO layer is formed.

14. The method according to claim 11, further comprising terminating the pulses after a continuous STO layer is formed.

15. The method according to claim 1, wherein the oxygen source material capable of forming an oxide with the titanium source material and the oxygen source material capable of forming an oxide with the strontium source material comprises ozone.

16. The method according to claim 1, wherein the oxygen source material capable of forming an oxide with the titanium source material is selected from the group consisting of water, oxygen, hydrogen peroxide, oxides of nitrogen, halide-oxygen compounds, peracids, alcohols, alkoxides, and oxygen-containing radicals.

17. The method according to claim 16, wherein the oxygen source material capable of forming an oxide with the strontium source material is selected from the group consisting of water, oxygen, hydrogen peroxide, oxides of nitrogen, halide-oxygen compounds, peracids, alcohols, alkoxides, and oxygen-containing radicals.

18. A method comprising:
alternately exposing a substrate to pulses of a first metal source material and a first oxygen source material, and
alternately exposing the substrate to pulses of a second metal source material and a second oxygen source material to form spaced-apart nanodots over the substrate, the nanodots forming a charge trap for a memory device,
wherein metals from the first and second metal source materials form a perovskite structure with oxygen from the first and second oxygen source materials.

19. The method according to claim 18, wherein the pulses produce strontium titanate (STO).

20. The method according to claim 18, wherein the perovskite structure is formed of a material selected from the group consisting of STO, $BaTiO_3$, $Pb(Mg_{1/3}Nb_{2/3})O_3$, $SrBi_2Ta_2O_9$ and $Ta_2O_5(Nb)$.

21. The method according to claim 18, wherein the pulses of the first and second metal source materials are each followed by a pulse of the first or the second oxygen source materials.

22. The method according to claim 18, further comprising terminating the pulses before a continuous layer is formed.

23. The method according to claim 18, wherein the charge trap is formed over a tunneling dielectric over the substrate.

24. The method according to claim 23, further comprising forming a barrier dielectric over the charge trap.

25. The method according to claim 24, further comprising forming a control gate over the barrier dielectric.

26. The method according to claim 18, the first and second oxygen source materials are a same material.

* * * * *